Nov. 24, 1970 E. E. CONRAD ET AL 3,542,550

PHOTOSENSITIVE GLASS TECHNIQUE FOR FORMING CONTACT HOLES IN PROTECTIVE GLASS LAYERS

Filed Sept. 30, 1966

ERNEST E. CONRAD
RONALD P. ESCH
ROBERT L. HALLEN
RICHARD A. LEONARD
WILLIAM A. PLISKIN
INVENTORS

BY [signature]
ATTORNEY

United States Patent Office 3,542,550
Patented Nov. 24, 1970

3,542,550

PHOTOSENSITIVE GLASS TECHNIQUE FOR FORMING CONTACT HOLES IN PROTECTIVE GLASS LAYERS

Ernest E. Conrad, Clinton Corners, Ronald P. Esch, Red Hook, Robert L. Hallen, Poughkeepsie, Richard A. Leonard, Red Hook, and William A. Pliskin, Poughkeepsie, N.Y., assignors to International Business Machines Corporation, Armonk, N.Y., a corporation of New York Filed Sept. 30, 1966, Ser. No. 583,262
Int. Cl. G03c *5/00;* H05k *3/28*
U.S. Cl. 96—34 4 Claims

ABSTRACT OF THE DISCLOSURE

A technique for forming contact holes in glass layers which serve to encapsulate and protect electronic components such as semi-conductor devices. In accordance with the preferred form of the technique a thin uniform film of glass on a substrate having the required contact holes is achieved by applying to the substrate a layer of fine particles in intimate contact with a photo-sensitive agent, exposing the layer to a predetermined pattern of light to sensitize the photo-sensitive agent in selected areas only, subjecting the layer to a developer for said photo-sensitive agent whereby the sensitized agent is developed and whereby the glass particles at said selected locations are removed, and heating the remaining glass particles to coalesce the same to form said film except for the areas from which the particles have been removed.

Figure 1:
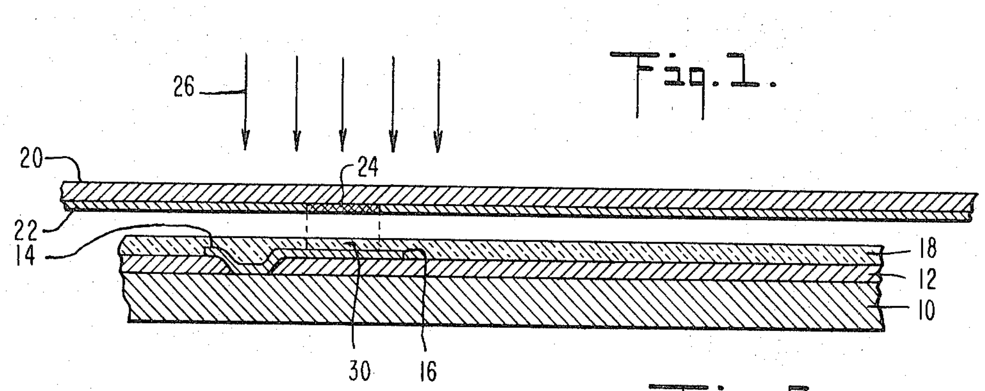

This invention relates to a method for forming electrical contact holes in the glass encapsulation of electronic components.

In the manufacture of various electrical components, such as resistors, capacitors and semi-conductor devices, it has been common practice to provide them with a tightly adherent protective jacket which serves as a hermetic seal that prevents the contamination of the components which might cause deterioration and degradation.

A wide variety of coating materials, such as plastic and glass, have been employed with some success. In general, thick protective jackets of these materials have been used with satisfactory results for some applications. However, the present trend in the electronic arts is toward miniaturizing of semi-conductor or solid state components. Thick protective coatings increase the bulk of such components and often such jackets are subject to cracking while operating over a range of operating temperatures.

More recently, pin-hole free, uniform, thin glass films having a thickness in the order of 0.4 micron have been achieved. Glass films can be applied by a variety of methods such as spraying or sedimentation of small particles of glass onto the surface of the component to be coated followed by a firing process. A particularly effective method has involved the sedimentation of fine glass particles onto a substrate from a colloidal suspension of glass by centrifuging, followed by firing the deposited layer. The glass powder so deposited forms a densely packed layer which, when fired for a short time at a temperature close to the softening point of the glass, has been successfully employed for the glass film passivation of these devices.

These encapsulating techniques have brought some difficulties in piercing the enclosing film for the purpose of establishing electrical contacts. According to the conventional practice, the glass encased component is coated with a photosensitive film which is exposed according to a predetermined pattern to condition it for the etching of holes in the glass with a suitable etchant. The etching of the glass coating is not always easy to control within precise limits and can result in over-etching. Moreover, it has been difficult to prevent the etching solution from attacking and in some cases destroying the metallurgy beneath the glass film.

It is, therefore, the principal objective of this invention to provide a method for forming electrical contact holes in the glass encapsulation of electronic components while avoiding the use of the conventional etching techniques.

According to the invention, a method with variants in details is provided for this purpose. A relatively simple procedure resides in depositing a suspension of glass particles containing a photoresist onto the substrate, utilizing either a photoresist which renders the coating insoluble to the developer upon exposure, or a photoresist which renders the coating soluble to the developer upon exposure, air drying the film, exposing the photosensitive coating through a suitable mask, developing, removing the photoresist and glass deposit in the exposed or unexposed areas, depending on the type of photoresist that is employed, and firing the remaining glass photoresist deposit to form a thin, continuous glass film. A somewhat more sophisticated technique according to the invention involves the spinning of a thin film of photoresist onto the substrate, air drying such film, centrifugally depositing a glass suspension onto the coated surface, spraying a photoresist over the deposited glass particles, air drying, exposing the component so treated through a mask of a suitable configuration, developing the photoresist, washing the glass coating from the areas at which the contact holes are to be formed, and firing the remaining glass deposit to form a thin envelope except for the points at which the contact holes are located. In the specific examples to be given, it is assumed that the photoresist that is employed is of the type which renders the coating insoluble to the developer upon exposure.

The foregoing and other objects, features and advantages of the invention, will be apparent from the following more particular description of preferred operative embodiments of the invention, as illustrated in the accompanying drawing, in which:

FIG. 1 is an enlarged more or less diagrammatic sectional view of a fragment of a semi-conductor wafer having thereon a coating of glass particles containing a photoresist together with an overlying photographic mask.

Figure 2:
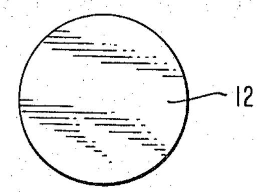
Figure 3:
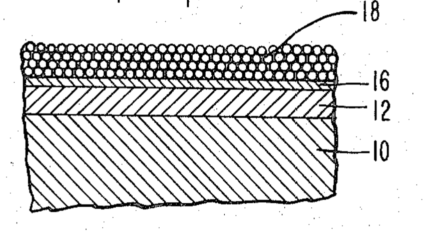
Figure 4:
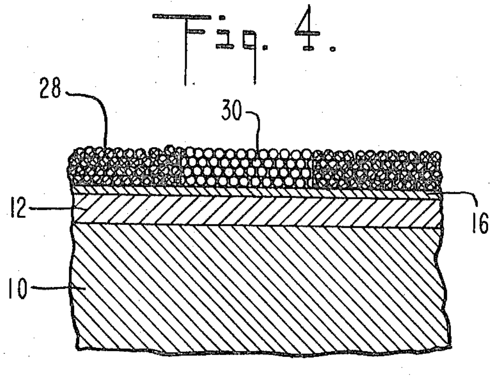
Figure 5:
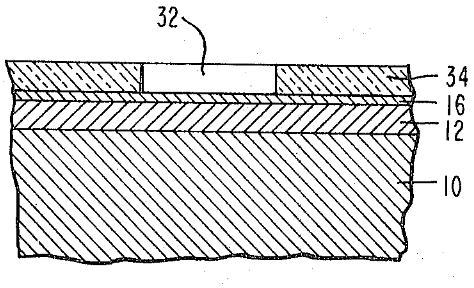

FIGS. 2 through 5 show successive steps in the formation of electrical contact holes in the glass encapsulation of the substrate component; FIG. 2 being a plan view of a semi-conductor wafer; FIG. 3 being an enlarged fragmentary sectional view of the wafer showing a layer of glass particles thereon; FIG. 4 showing areas of polymerized and unpolymerized photoresist in the glass particle layer; and FIG. 5 showing the thin adherent glass coating and the connecting hole therein according to the method.

In practicing the present invention, a suitable glass is ground as by ball milling to form a powdered glass. Different types of glass are suitable for use in accordance with the method of the present invention. The type of glass selected may depend upon the particular application at hand. For example, the component to receive the thin glass film of uniform thickness may require a chemical resistant glass, such as a borosilicate type glass, for protective purposes and for withstanding high operating temperatures. Also, the component may be a device such as a transistor which will operate over a wide range of temperatures which may dictate that for protective purposes, the coefficient of thermal expansion of the semiconductor material of the device and that of the glass be substantially equal, so as to minimize stresses which might otherwise crack the glass during operation.

U.S. Pat. 3,212,921 to Pliskin and Conrad discloses a method by which glass particles of proper size can be obtained. According to this patent, the powdered glass from the ball milling procedure is introduced into and dispersed in a suitable suspending medium. An organic fluid, such as methyl alcohol, is one of many which are satisfactory for this purpose. Other appropriate fluids are ethyl alcohol, isopropyl alcohol, acetone and water. This suspension may then be subjected to centrifugal forces for a few minutes to separate out the larger glass particles in the suspension. A refinement exists in decanting the fluid after a preliminary centrifugal separation, and subjecting the smaller particles of glass in suspension in the decanted fraction to further centrifugal force at a higher speed to separate out the desired finely divided particles.

The desired glass particles may be dried by the application of mild heat or at room temperature. The glass particles suitable for the method may have a mean particle size in the range of 0.1 to 2 microns. The more superior results are usually obtained by using the smaller particle size. The selected glass particles are now ready for deposit onto the surface of the component to be encapsulated. For this purpose, they are put into a second suspending medium such as methyl acetate, ethyl acetate, isopropyl alcohol, acetone, methyl ethyl ketone, isamyl tertiary butyl alcohol mixed with a small amount of secondary butyl alcohol, or mixtures of the above. Other mixtures within a certain range of dielectric constants can also be used, depending on the type of glass used and the particle size, as taught in Pliskin and Conrad Pats. Nos. 3,212,921, issued Oct. 19, 1965 and 3,212,929, issued Oct. 19, 1965. These mixtures can include hydrocarbons or other organic fluids with low dielectric constants, providing they are mixed with higher dielectric constant fluids (such as alcohols) so that the mixture is in the proper dielectric constant range for proper sedimentation. In many cases the final colloidal suspension is not made from previously dried fine glass particles. In these cases, the coarse glass particles are removed from the suspension by centrifugation and the suspension remaining which includes the desired fine particles is referred to as the "concentrate," which is later diluted with the proper fluids to make a suspension with the desired dielectric constant and glass concentration.

According to one practice, a photoresist in the amount of 1% to 20% of the suspension by volume may be added to the glass suspension. A suitable photoresist is Eastman Kodak's KPR which is a cinnamic ester of polyvinyl alcohol plus sensitizers, and which derives its designation from the descriptive phrase "Kodak Photo Resist." Of course, the particular photoresist is not critical, and any suitable photosensitive material may be employed. As stated, photoresists which are rendered soluble to a developer upon exposure can also be utilized.

The glass suspension-photoresist mixture is then applied to the surface of the component to form thereon a layer of glass particles. This step may be performed by spraying the suspension onto the surface of the component by means of an air brush preferably using compressed $N_2$ as the carrier rather than compressed air. The film so applied to the component is then air dried for a period of an hour or two at room temperature. The drying process can be performed in a few minutes if performed at a temperature of 60° C., for example. Indeed, it will dry immediately if the wafer is sprayed while the latter is on a hot plate.

The glass particle-coated component is now exposed through a suitable mask to polymerize the photoresist in the desired areas. The mask is suitably prepared as a glass photographic plate that has its exposed silver areas coinciding with the locations of the holes that are to be formed ultimately in the glass envelope. After the mask is placed in position over the particle-coated surface of the component, it is exposed to light, e.g. ultra-violet light, to polymerize the photoresist throughout except where the holes are to be formed.

The component is now subjected to a developer, e.g. an Eastman Kodak KPR developer, or some suitable substitute, such as trichloroethylene. The component is then placed in the furnace and fired in the vicinity of the softening point of the glass to volatilize the photoresist and remaining developer and to coalesce the glass to form a continuous film having the desired contact holes therein.

Alternatively, instead of adding the photoresist to the glass particle suspension, the same may be applied as a thin film directly to the surface of the component being treated. This is best performed by holding the component on a spin table by vacuum and applying a few drops of the photoresist on the center of the component. The component is then spun at an appropriate speed within the range, for example, of 1000–4000 r.p.m. to obtain the desired film thickness over the entire surface of the component. Any excess photoresist is spun off during the initial acceleration of the spinning table. When so applied, the photoresist is again dried, preferably at ambient or slightly elevated temperature.

When dried, the component is ready to receive the glass particle suspension which, in this instance, is preferably deposited onto the surface of the component by centrifugal sedimentation. Accordingly, the component is placed into a centrifugal vial and covered with the glass particle suspension. The centrifugal device is then rotated at such speed and for a period of time sufficient to deposit onto the component the desired thickness of the glass particles. After the component is removed from the centrifugal vial with its glass particle coating adhering thereto, its surface is sprayed with more of the photoresist, such as KPR or a suitable substitute, and is then dried. The remaining steps of the alternative method correspond to those described in connection with the more simplified procedure and consist of exposure through an appropriate mask, development of the photoresist in a suitable developer and firing the component to form the continuous glass film having the desired contact holes therein.

In either event, the removal of the glass particles at the hole locations not removed by the development of the photoresist, may be acelerated by a short period of ultrasoning during which the components are subjected to ultrasonic impulses in the bath of KPR developer, trichloroethylene, or the like. This ultrasonic agitation is effective to remove all of the free glass particles in a few seconds to a few minutes.

The firing time and temperature are, of course, related for any given glass which is selected for the encapsulating operation. We have examined glasses with firing temperatures from 400° C. to 1100° C., for example. Corning's borosilicate (Tungsten Sealing-Nonex) No. 7720 will soften at 755° C. while its borosilicate No. 7740 (Pyrex) will soften at 820° C. Whatever the softening temperature of the glass may be, slightly higher temperatures, generally speaking, require shorter firing times for a particular glass. Indeed, the application of heat of 15° C. to 20° C. beyond the normal softening point of the glass and for a slightly longer period of time appears to yield the best results. Thus, glass that is normally fired at 760° C. will form an excellent film in 10 minutes when fired at 780° C. A glass film, normally fired at 565° C. for 8 minutes, yielded highly satisfactory results when fired at 580° C. for 10 minutes.

Further illumination of the invention is provided by the drawing. In FIG. 1, a semi-conductor crystal 10, silicon, for example, has formed thereon on oxide coating 12 and has associated therewith a metal connecting land 14. It is this structure which is to be encapsulated and it is the leg 16 of the metal land to which access is desired for the purpose of electrical contact and for which the hole in the glass film is required. The photoresist, glass-mixture layer 18 is exposed through a glass photographic plate 20 having on one face thereof areas of clear photographic emulsion 22 with areas of fixed silver photographic emulsion 24 where holes are to be formed in the glass envelope. When the photoresist, glass-mixture 18 is exposed through the photographic plate 20 by subjecting the same to ultraviolet radiation, represented by the lines and arrows 26, the photoresist in the layer 18 will be exposed through the clear photographic emulsion 22 whereby the photoresist is polymerized except under the areas 24 of the mask, i.e. area 30.

This condition of the structure is shown in FIG. 3, wherein the substrate 10 and the photoresist, glass-mixture 18 are clearly shown. When the exposed component is now subjected to a photoresist developer, the photo-resist, glass-mixture in the area 30, under area 24, will be subject to attack such that the photoresist and the glass particles in area 30 are washed out and removed. When the component is now subjected to the firing process, the glass particles will form a continuous smooth envelope 34 encasing the component except for the holes 32 which have been neatly formed through the film. The photo-resist in areas 28 will have been oxidized or volatilized during the glass firing process.

It can be seen, therefore, that in its larger aspects, the method of forming a thin film of glass on a substrate and forming voids in the film entails application of a layer of fine glass particles to the substrate in intimate contact with a photo-sensitive agent, exposing the layer to a predetermined pattern of light to polymerize the photosensitive agent in selected areas, exposing the layer to a developer for the removal of the glass particles in unexposed areas, and softening the remaining glass particles during which time the photoresist oxidizes or volatilizes and the glass particles coalesce into a film covering the substrate except for the areas from which the glass particles are removed.

The method as described suggests variations in certain of its sequential steps. These steps can be combined to effect still other variations in the procedure by which good results can be obtained. For example, the glass suspension with a protoresist therein may be deposited on the substrate by centrifugal sedimentation as well as by spraying the suspension on the substrate. In this event, no preliminary film of the photo-sensitive agent will be applied to the substrate nor will additional photo-sensitive agent be applied to the glass layer after it has been deposited. Other variations will suggest themselves to those skilled in the art.

While the invention has been particularly shown and described in reference to preferred embodiments thereof, it will be understood by those skilled in the art that the foregoing and other changes in form and details may be made therein without departing from the spirit and scope of the invention.

What is claimed is:

1. The method of forming a thin uniform film of glass on a substrate and forming voids in said film at selected locations comprising, applying a photoresist which becomes insoluble upon exposure to light to the surface of said substrate to form a coating and drying said coating, applying a layer of fine glass particles to said photoresist coating on said substrate, coating the glass particles with an additional film of said photoresist, exposing the thus formed laminar combination to a predetermined pattern of light to insolubilize said photoresists in selected areas only, subjecting the laminar combination to a developer from said photoresist whereby said photoresist and glass particles are removed in the unexposed areas, and heating the remaining glass particles to coalesce the same to form said film except for the areas from which the particles have been removed.

2. The method of claim 1, wherein the photoresist is applied to the substrate while spinning the substrate to form on the surface thereof a thin film of the photoresist under centrifugal influence and the film so applied is dried, depositing on the film a layer of the glass particles from a suspension thereof by centrifugal sedimentation, and a film of photoresist is sprayed over the deposited particle layer and dried prior to exposure, development and heating.

3. The method of forming a thin uniform film of glass on a substrate and forming voids in said film at selected locations comprising, applying a photoresist which becomes soluble upon exposure to light to the surface of said substrate to form a coating and drying said coating, applying a layer of fine glass particles to said photoresist coating on said substrate, coating the glass particles with an additional film of said photoresist, exposing the thus formed laminar combination to a predetermined pattern of light to solubilize said photoresist in selected areas only, subjecting the laminar combination to a developer for said photoresist whereby said photoresist and glass particles are removed in the exposed areas, and heating the remaining glass particles to coalesce the same to form said film except for the areas from which the particles have been removed.

4. The method of claim 3, wherein the photoresist is applied to the substrate while spinning the substrate to form on the surface thereof a thin film of the photoresist under centrifugal influence and the film so applied is dried, depositing on the film a layer of the glass particles from a suspension thereof by centrifugal sedimentation, and a film of the photoresist is sprayed over the deposited particle layer and dried prior to exposure, development and heating.

References Cited

UNITED STATES PATENTS 3,355,291 11/1967 Baird et al. ---------- 96—27

GEORGE F. LESMES, Primary Examiner

R. E. MARTIN, Assistant Examiner

U.S. Cl. X.R.

29—588, 627; 96—36, 36.2; 117—8